United States Patent
Sato

(10) Patent No.: US 6,367,066 B1
(45) Date of Patent: Apr. 2, 2002

(54) SYSTEM FOR SYNTHESIZING A CIRCUIT BY RE-WRITING SIGNED VARIABLES INTO UNSIGNED VARIABLES AND SHARING RESOURCES FOR IDENTICAL OPERATIONS HAVING DIFFERENT TIMING

(75) Inventor: Koichi Sato, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/237,256

(22) Filed: Jan. 26, 1999

(30) Foreign Application Priority Data

Jan. 26, 1998 (JP) .......................................... 10-012849

(51) Int. Cl.[7] .............................................. G06F 17/50
(52) U.S. Cl. ......................................................... 716/18
(58) Field of Search ..................................... 716/27, 18

(56) References Cited

U.S. PATENT DOCUMENTS

| | | | | | |
|---|---|---|---|---|---|
| 5,613,117 A | * | 3/1997 | Davidson | ....................... | 717/8 |
| 5,836,014 A | * | 10/1998 | Faiman | ........................... | 717/7 |
| 5,841,663 A | * | 11/1998 | Sharma | ........................ | 716/18 |
| 6,055,619 A | * | 4/2000 | North | ........................... | 712/36 |

OTHER PUBLICATIONS

Burgess, N., "Removal of sign–extension circuitry from Booth's algorithm multiplier–accumulators", IEEE, pp. 1413–1415.*

* cited by examiner

Primary Examiner—John F. Niebling
Assistant Examiner—Stacy A Whitmore
(74) Attorney, Agent, or Firm—Foley & Lardner

(57) ABSTRACT

A circuit synthesizing method for synthesizing a desired circuit from a behavior description indicating the behavior of a design circuit that is created in a hardware description language stores in advance translation rules for re-writing operations using signed variables into operations using unsigned variables, detects operations using signed variables from a behavior description, extracts translation rules associated with the detected signed variables, re-writes said operations using signed variables into operations using unsigned variables according to the extracted translation rules, and based on said re-written behavior description, finds identical operations that do not behave in the same timing and carries out the process of sharing a functional unit.

27 Claims, 9 Drawing Sheets

SYSTEM FOR SYNTHESIZING A CIRCUIT BY RE-WRITING SIGNED VARIABLES INTO UNSIGNED VARIABLES AND SHARING RESOURCES FOR IDENTICAL OPERATIONS HAVING DIFFERENT TIMING

BACKGROUNDS OF THE INVENTION

1. Field of the Invention

The present invention relates to a circuit synthesizing method for LSIs and other types of integrated circuit devices and a circuit synthesizing device therefor, and more particularly to a circuit synthesizing method for enabling to synthesize a circuit with a small circuit area and to a circuit synthesizing device therefor.

2. Description of the Related Art

In recent years, LSIs in general have become larger in size and more complex in structure, leading to increasing demand for a system that can automate logical design in order to achieve higher efficiency in LSI design. As a means of realizing automated circuit design, a circuit synthesizing device has been provided for describing the behavior of a circuit using the hardware description language and then synthesizing a desired circuit according to the description that has been input.

In general, the design levels of circuit synthesizing devices consist of three types: behavior, RTL (Register Transfer Level), and logic.

The behavior level is the same level as considering an algorithm using the programming language, which is a design level for defining "what" behaves "how." In behavior synthesis, scheduling is performed to determine the clock cycle and the procedure in which an operation is to be carried out on a behavior description. As a result of this scheduling, registers and functional units are allocated to variables and registers (i.e., binding) as necessary, and a state machine part for controlling the sequence of the operation is generated (i.e., state generation).

The RTL is a level one order below the behavior level. This level defines an architecture using such components as registers, functional units, and a state machine part, and clarifies the behaviors of individual clock cycles. Actions in RTL synthesis include inferring registers from descriptions, optimizing the operational sequence, and allocating resources.

The logic level is the lowest level, which expresses a design circuit using Boolean expressions, ASIC net lists, and so forth. The term "logic synthesis" usually refers to synthesis at the logic level.

It should be noted here that a functional unit very often has a large circuit area. When synthesizing a circuit, therefore, sharing of a functional unit that is not used simultaneously is desirable so that the area of a logic-synthesized circuit can be prevented from becoming too large.

As an example, we will take the case in which the following is input into a circuit synthesizing device as a behavior description:

unsigned a1(0:2),b1(0:2),c1(0:4);
unsigned a2(0:3),b2(0:3),c2(0:6);
if(cond)
{
c1=a1*b1;
}
else{ c2=a2*b2;
} where a1 and b1 are unsigned variables that have 2 bits in total beginning with 0 bit, respectively; c1 is an unsigned variable that has 4 bits in total beginning with 0 bit; a2 and b2 are unsigned variables that have 3 bits in total beginning with 0 bit, respectively; and c2 is an unsigned variable that has 6 bits in total beginning with 0 bit. if(cond) else represents a process for selecting either of c1 or c2, depending on the state specified by the value of cond. While the behavior description above shows an example of a description that performs an operation using unsigned variables, there are also descriptions that perform operations using signed variables.

When carrying out behavior synthesis based on a behavior description similar to the one shown above, conventional circuit synthesizing devices first find operations that are identical to each other but are not used in the same timing in the behavior description, and cause these operations to share the functional unit that are associated with them. Thus, in the behavior description shown above, the operations c1=a1*b1 and c2=a2*b2 are not carried out simultaneously, so a behavior is so synthesized as to carry out a1*b1 and a2*b2 separately, using the same functional unit (i.e., a multiplier).

One example of the results of behavior synthesis according to the procedure described above is shown in FIG. 7.

FIG. 7 shows an example of the results of behavior synthesis that is output from a conventional circuit synthesizing device. In FIG. 7, "MUX" represents a multiplexer and "×" a multiplier (i.e., a functional unit).

As shown in FIG. 7, the number of multiplexers for switching variables to be input into a functional unit increases within a behavior-synthesized description. Even so, the area of the synthesized circuit can be reduced, since each multiplexer requires a smaller circuit area than a functional unit.

In conventional circuit synthesizing device, not only functional units but also registers are shared. Register sharing herein means to have one register to hold multiple pieces of data (variables) that are not processed in the same timing.

FIGS. 8 and 9 are data transfer diagrams showing an example of a register sharing method in a conventional circuit synthesizing device conducts. Of these, FIG. 8 is a block diagram showing a register sharing method for signed variables, and FIG. 9 showing a register sharing method for unsigned variables.

FIGS. 8 and 9 show the register sharing method that is conducted when transferring the value of the variable a1 to the register c1 and the value of the variable b1 to the register c2, as follows:

c1=a1;
c2=b1;

Here, the registers c1 and c2 are implemented (i.e., shared) in one register (5 bits).

For example, as shown in FIG. 8, when transferring a1, which is a 2-bit signed variable, and b1, which is a 4-bit signed variable, to a common register (5 bit), bits are added to the variables a1 and b1, respectively, in the numbers that are less than the bit count of the destination register. The multiplexer (MUX) then switches the variable to be transferred to the register, between a1 and b1. Here, since the $0^{th}$ bit of the variable a1 and that of the variable b1 are signed bits, the same data as the signed bits are inserted in the bits that are in short.

On the other hand, as shown in FIG. 9, for example, when transferring a2, which is a 4-bit unsigned variable, and b2, which is a 2-bit unsigned variable, to a common register (5 bit), bits are added to the variables a2 and b2, respectively, in the numbers that are less than the bit count of the destination register, as with the case above for signed bits. The multiplexer (MUX) then switches the variable to be transferred to the register, between a2 and b2. Here, since neither the variable a2 nor b2 holds a signed bit, data "0s" are inserted to the number of bits that are less than the number of bits in the register.

Thus, by conducting sharing for not only functional units but also for registers, a reduction in circuit area can be realized.

Generally, in a conventional circuit synthesizing device as described above, a behavior description is created by employing either operations using signed variables or operations using unsigned variables. However, for cases in which two types of operations, i.e., those using signed variables and those using unsigned variables, exist in the same behavior description, two types of functional units are required, making it impossible to share these functional units.

Thus, conventional circuit synthesizing devices have a drawback that the area of a circuit cannot be minimized in design, since full sharing of functional units and registers are not possible.

SUMMARY OF THE INVENTION

An objective of the present invention is to provide a circuit synthesizing device that can synthesize a circuit with a small circuit area by enabling sharing of functional units and registers even when both operations using signed variables and unsigned variables exist, and a method therefor.

Another objective of the present invention is to provide a circuit synthesizing device that can perform simulation of circuit behavior and other processes at a higher speed by using C language for describing hardware in which both operations using signed variables and unsigned variables exist, and a method therefor.

According to the first aspect of the invention, a circuit synthesizing method for synthesizing a desired circuit from a behavior description indicating the behavior of a design circuit that is created in a hardware description language, comprising the steps of re-writing operations using signed variables within the behavior description into operations using unsigned variables, and based on the re-written behavior description, finding identical operations that do not behave in the same timing and carrying out the process of sharing a functional unit for the variables thus found.

In the preferred construction, translation rules for re-writing operations using signed variables into operations using unsigned variables are stored in advance, and operations using signed variables within the behavior description are re-written into operations using unsigned variables according to the translation rules.

In another preferred construction, translation rules for re-writing operations using signed variables into operations using unsigned variables are stored in advance, operations using signed variables are detected from the behavior description, translation rules associated with the detected signed variables are extracted, and the operations using signed variables are re-written into operations using unsigned variables according to the extracted translation rules.

In another preferred construction, when in the operation re-writing process, the operation is multiplication, exclusive-ORs for the signed bits of the signed variables are obtained individually, when the result of the exclusive-OR operation is 0, the result of multiplication for the variable is output as are, and when the result of the exclusive-OR operation is 1, a negative sign is added to the result of multiplication for the variable.

In another preferred construction, translation rules for re-writing operations using signed variables into operations using unsigned variables are stored in advance, operations using signed variables are detected from the behavior description, translation rules associated with the detected signed variables are extracted, when in the operation re-writing process, the operation is multiplication, exclusive-ORs for the signed bits of the signed variables are obtained individually, when the result of the exclusive-OR operation is 0, the result of multiplication for the variable is output as are, and when the result of the exclusive-OR operation is 1, a negative sign is added to the result of multiplication for the variable.

According to the second aspect of the invention, a circuit synthesizing method for synthesizing a desired circuit from a behavior description indicating the behavior of a design circuit that is created in a hardware description language, comprising the steps of finding variables that are not processed in the same timing from the behavior description, comparing a bit count of the variable to the bit count of the register to be shared, wherein if the bit count of the variable is less than the bit count of the register to be shared, adding same data as the signed bits, in the case of a signed variable, in the number of bits by which the number of bits in the signed variable is less than the number of bits in the register, and adding pre-determined data, in the case of an unsigned variable, in the number of bits by which the number of bits in the signed variable is less than the number of bits in the register, and then carrying out the process of sharing a register.

According to the third aspect of the invention, a circuit synthesizing method for synthesizing a desired circuit from a behavior description indicating the behavior of a design circuit that is created in a hardware description language, comprising the steps of re-writing operations using signed variables within the behavior description into operations using unsigned variables, and based on the re-written behavior description, finding identical operations that do not behave in the same timing and carrying out the process of sharing a functional unit for the variables thus found, finding variables that are not processed in the same timing from the behavior description, comparing a bit count of the variable to the bit count of the register to be shared, wherein if the bit count of the variable is less than the bit count of the register to be shared, adding same data as the signed bits, in the case of a signed variable, in the number of bits by which the number of bits in the signed variable is less than the number of bits in the register, and adding pre-determined data, in the case of an unsigned variable, in the number of bits by which the number of bits in the signed variable is less than the number of bits in the register, and then carrying out the process of sharing a register.

In the preferred construction, translation rules for re-writing operations using signed variables into operations using unsigned variables are stored in advance, and the operations using signed variables within the behavior description are re-written into operations using unsigned variables according to the translation rules.

In another preferred construction, "0s" are added as the pre-determined data, in the number of bits that is the difference between the number of bits in the unsigned variables and the number of bits in the register, in the case of an unsigned variable.

According to the fourth aspect of the invention, a circuit synthesizing device for synthesizing a desired circuit from a behavior description indicating the behavior of a design circuit that is created in a hardware description language, comprising re-writing means for re-writing operations using signed variables within the behavior description into operations using unsigned variables, and means for sharing a functional unit for performing identical operations that do not behave in the same timing from the re-written description.

In the preferred construction, the circuit synthesizing device further comprises translation table storing means in which translation rules for re-writing operations using signed variables into operations using unsigned variables are stored in advance, and the operation re-writing means re-writes operations using signed variables within the description into operations using unsigned variables according to the translation rules that are stored in the translation table storing means.

In another preferred construction, the circuit synthesizing device further comprises translation table storing means in which translation rules for re-writing operations using signed variables into operations using unsigned variables are stored in advance, the operation re-writing means detects operations using signed variables from the behavior description, extracts translation rules associated with the detected signed variables from the translation table storing means, and re-writes the operations using signed variables into operations using unsigned variables according to the extracted translation rules.

In another preferred construction, the operation re-writing means, when in the operation re-writing process, the operation is multiplication, obtains exclusive-ORs for the signed bits of the signed variables individually, when the result of the exclusive-OR operation is 0, outputs the result of multiplication for the variable as are, and when the result of the exclusive-OR operation is 1, adds a negative sign to the result of multiplication for the variable.

In another preferred construction, the circuit synthesizing device further comprises translation table storing means in which translation rules for re-writing operations using signed variables into operations using unsigned variables are stored in advance, the operation re-writing means detects operations using signed variables from the behavior description, extracts translation rules associated with the detected signed variables from the translation table storing means, when in the operation re-writing process, the operation is multiplication, obtains exclusive-ORs for the signed bits of the signed variables individually, when the result of the exclusive-OR operation is 0, outputs the result of multiplication for the variable as are, and when the result of the exclusive-OR operation is 1, adds a negative sign to the result of multiplication for the variable.

According to the fifth aspect of the invention, a circuit synthesizing device for synthesizing a desired circuit from a behavior description indicating the behavior of a design circuit that is created in a hardware description language, comprises:

means for finding variables that are not processing in the same timing from the behavior description, means for, comparing a bit count of the variable to the bit count of the register to be shared, wherein if the bit count of the variable is less than the bit count of the register to be shared, add the same data as the signed bits, in the case of a signed variable, in the number of bits by which the number of bits in the signed variable is less than the number of bits in the register, and adding predetermined data, in the case of an unsigned variable, in the number of bits by which the number of bits in the signed variable is less than the number of bits in the register, and means for, after adding data to said variables, carrying out the process of sharing a register.

In the preferred construction, "0s" are added as the pre-determined data, in the number of bits that are in short, in the case of an unsigned variable.

According to the sixth aspect of the invention, a circuit synthesizing device for synthesizing a desired circuit from a behavior description indicating the behavior of a design circuit that is created in a hardware description language, comprising means for re-writing operations using signed variables within the behavior description into operations using unsigned variables, means for, based on the re-written behavior description, finding identical operations that do no behave in the same timing and carrying out the process of sharing a functional unit for the variables thus found, means for finding variables that are not processed in the same timing from the behavior description, means for comparing a bit count of the variable to the bit count of the register to be shared, wherein if the bit count of the variable is less than the bit count of the register to be shared, adding same data as the signed bits, in the case of a signed variable, in the number of bits by which the number of bits in the signed variable is less than the number of bits in the register, and adding pre-determined data, in the case of an unsigned variable, in the number of bits by which the number of bits in the signed variable is less than the number of bits in the register to be shared, and means for, after adding data to the variables, carrying out the process of sharing a register.

In the preferred construction, the circuit synthesizing device further comprises translation table storing means in which translation rules for re-writing operations using signed variables into operations using unsigned variables are stored in advance, and the operation re-writing means re-writes operations using signed variables within the description into operations using unsigned variables according to the translation rules that are stored in the translation table storing means.

According to a further aspect of the invention, a computer readable memory that records a circuit synthesizing program for synthesizing a circuit from a behavior description indicating the behavior of a circuit that is created by a computer in a hardware description language, wherein the circuit synthesizing program causes the computer to carry out a process of finding variables that are not processed in the same timing from the behavior description;

comparing a bit count of the variable to the bit count of the register to be shared, wherein if the bit count of the variable is less than the bit count of the register to be shared, adding same data as the signed bits in the case of a signed variable, in the number of bits by which the number of bits in the signed variable is less than the number of bits in the register, and adding pre-determined data in the case of an unsigned variable, in the number of bits by which the number of bits in the signed variable is less than the number of bits in the register, and then carrying out the process of sharing a register.

According to a further aspect of the invention, a computer readable memory that records a circuit synthesizing program for synthesizing a circuit from a behavior description indicating the behavior of a circuit that is created by a computer in a hardware description language, wherein the circuit synthesizing program causes the computer to carry out the processes of finding variables that are not processed in the same timing from the behavior description, when the bit count of the variable is in short when compared with the bit count of the register to be shared, adding the same data as the signed bits in the number of bits that are in short in the case of a signed variable, and adding the pre-determined data in the number of bits that are in short in the case of an unsigned variable, and then carrying out the process of sharing a register.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings.

DESCRIPTION OF THE PREFERRED EMBODIMENT

The preferred embodiment of the present invention will be discussed hereinafter in detail with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

A circuit synthesizing device according to the present invention enables a functional unit to be shared between an operation using signed variables and an operation using unsigned variables that are not processed in the same timing. Although the following describes a case in which behavior synthesis is conducted from a behavior description, this can also be applied to cases in which RTL synthesis is conducted from an RTL description.

Figure 1:
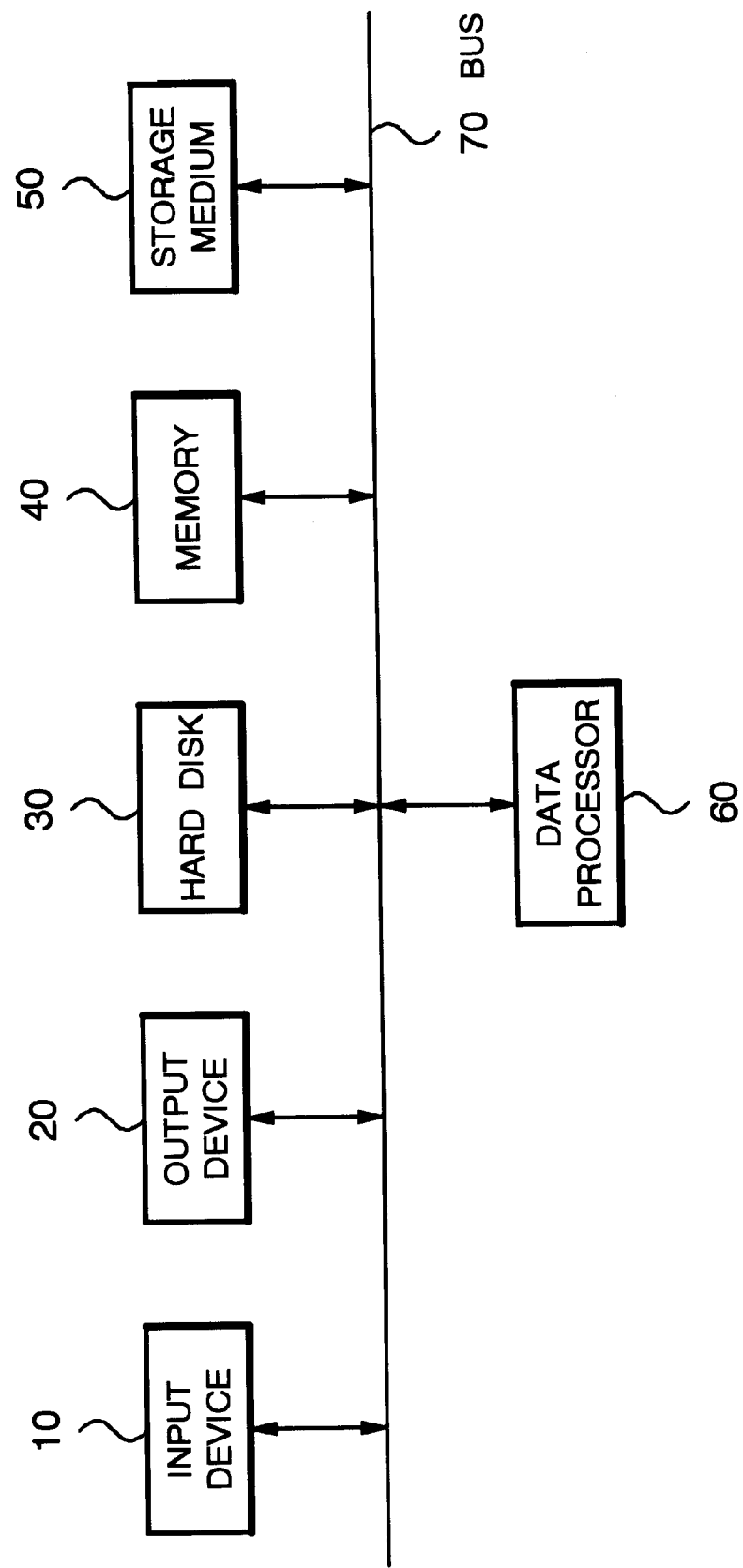
FIG. 1 is a block diagram showing the configuration of a circuit synthesizing device according to the present invention.

FIG. 1 is a block diagram showing the configuration of a circuit synthesizing device according to an embodiment of the present invention.

In FIG. 1, the circuit synthesizing device includes the following components as components comprising the computer: input devices 10 for inputting behavior descriptions, output devices 20 for outputting the results of behavior synthesis, a hard disk 30 for storing behavior descriptions that have been input and the results of behavior synthesis, a memory 40 for holding data required for behavior synthesis, a storage medium 50 in which a program for performing behavior synthesis is recorded, a data processor 60 for executing behavior synthesis according to the program recorded in the storage medium 50, a bus 70 for connecting the input devices 10, such as a keyboard, the output device 20, such as a display and a printer, the hard disk 30, the memory 40, the storage medium 50, and the data processor 60.

The data processor 60 reads a program recorded in the storage medium 50, and executes a process, which will be described later, according to the program. The storage medium 50 herein may be a magnetic disk, a semi-conductor memory, a CD-ROM, or other recording means.

The memory 40 is provided with a translation table 100, which will be described later. In the translation table 100, translation rules for translating operations using signed variables into operations using unsigned variables are stored in advance.

The data processor 60 finds operations using signed variables in a behavior description, translates the operations using signed variables to operations using unsigned variables according to the translation rules stored in the translation table 100, and performs behavior synthesis based on the behavior description thus translated.

Next, the operation of a circuit synthesizing device according to the present embodiment will be described with reference to FIGS. 2 to 5.

Figure 2:
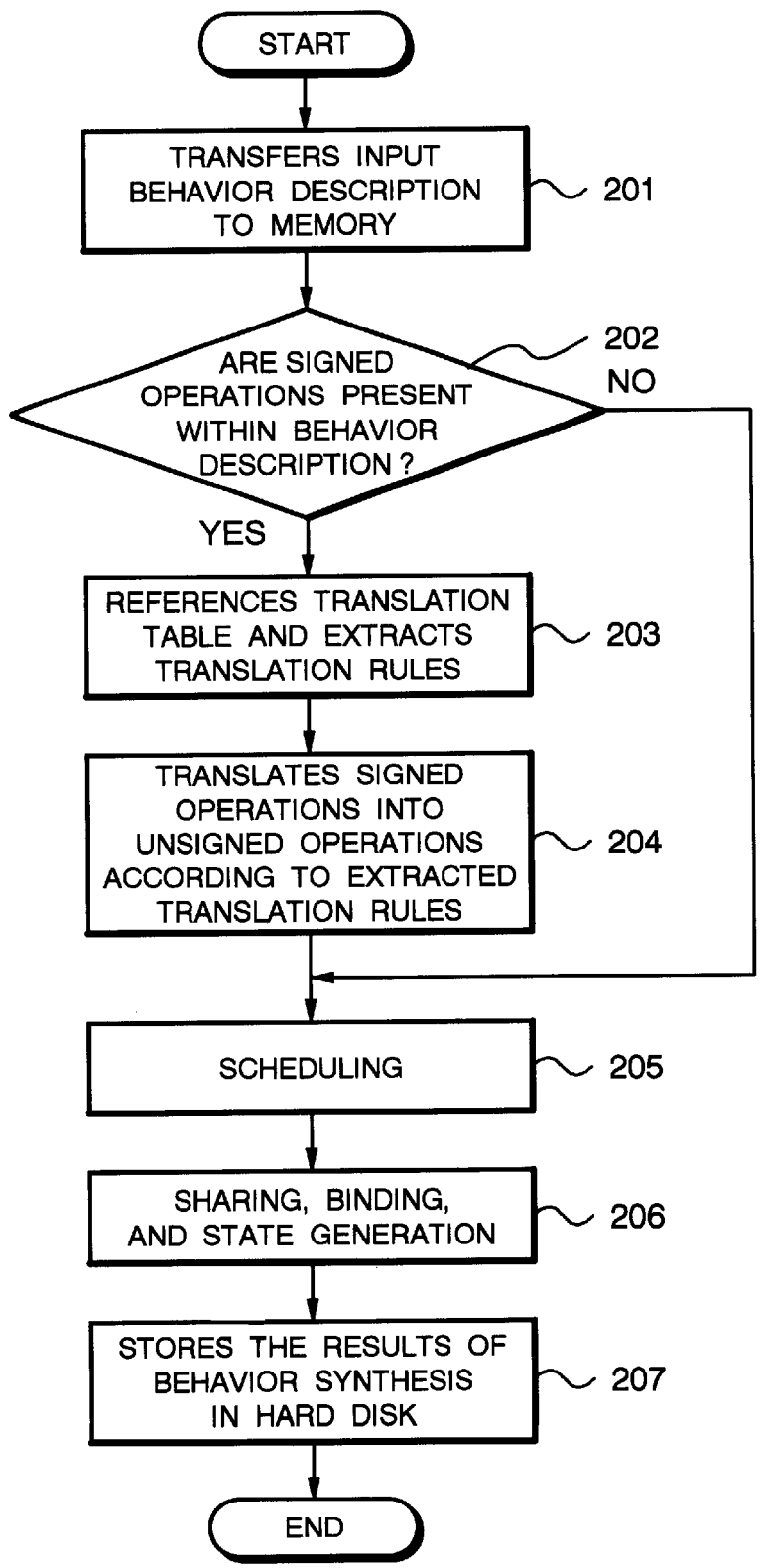
FIG. 2 is a flow chart showing the processing procedure for the circuit synthesizing method carried out by a circuit synthesizing device according to the present invention.

FIG. 2 is a flow chart showing the processing procedure for the circuit synthesizing method carried out by a circuit synthesizing device according to the present invention.

In FIG. 2, after a behavior description is input by the operator to direct the computer to conduct behavior synthesis, the data processor 60 translates the behavior description stored in the hard disk 30 into a processable data format, and transfers the results to the memory 40 (Step 201).

The data processor 60 then searches the behavior description stored in the memory 40 for operations using signed variables (Step 202). When it finds signed variables within the behavior description, it references the translation table 100 stored in the memory 40 and extracts the applicable translation rules from the translation table 100 (Step 203).

The data processor 60 then re-writes the behavior description by translating the operations using signed variables into operations using unsigned variables according to the extracted translation rules (Step 204).

The data processor 60 then carries out scheduling according to the re-written behavior description (Step 205), and completes behavior synthesis by performing sharing of a functional unit, allocation of a register, binding, and state generation (Step 206). The results of behavior synthesis (e.g., an RTL description) is stored in the hard disk 30 (Step 207), and output in response to a request from the operator using the output device 20.

The process of enabling a functional unit to be shared is the same as the process in a conventional circuit synthesizing device; it finds operations that are identical to each other but are not used in the same timing from a behavior description, and cause these operations to share the associated functional unit.

When no signed variables are found within the behavior description during the process of Step 202, on the other hand, the processor proceeds to the scheduling process of Step 205 to perform scheduling according to the input behavior description. The processes thereafter are the same as Steps 206 and 207 described above.

The operation of a circuit synthesizing device according to the present invention will be described in greater detail with reference to FIGS. 3 to 5.

As an example, we will take the case in which the following is input into a circuit synthesizing device as a behavior description:

signed a1(0:3),b1(0:3),c1(0:6);
unsigned a2(0:3),b2(0:3),c2(0:6);
if(cond)
{
c1=a1*b1;
}
else{
c2=a2*b2;
} where a1 and b1 are signed variables that have 3 bits in total beginning with 0 bit, respectively; c1 is a signed variable that has 6 bits in total beginning with 0 bit; a2 and b2 are unsigned variables that have 3 bits in total beginning with 0 bit, respectively; and c2 is an unsigned variable that has 6 bits in total beginning with 0 bit. if(cond) else represents a process for selecting either of c1 or c2, depending on the state specified by the value of cond.

Figure 3:
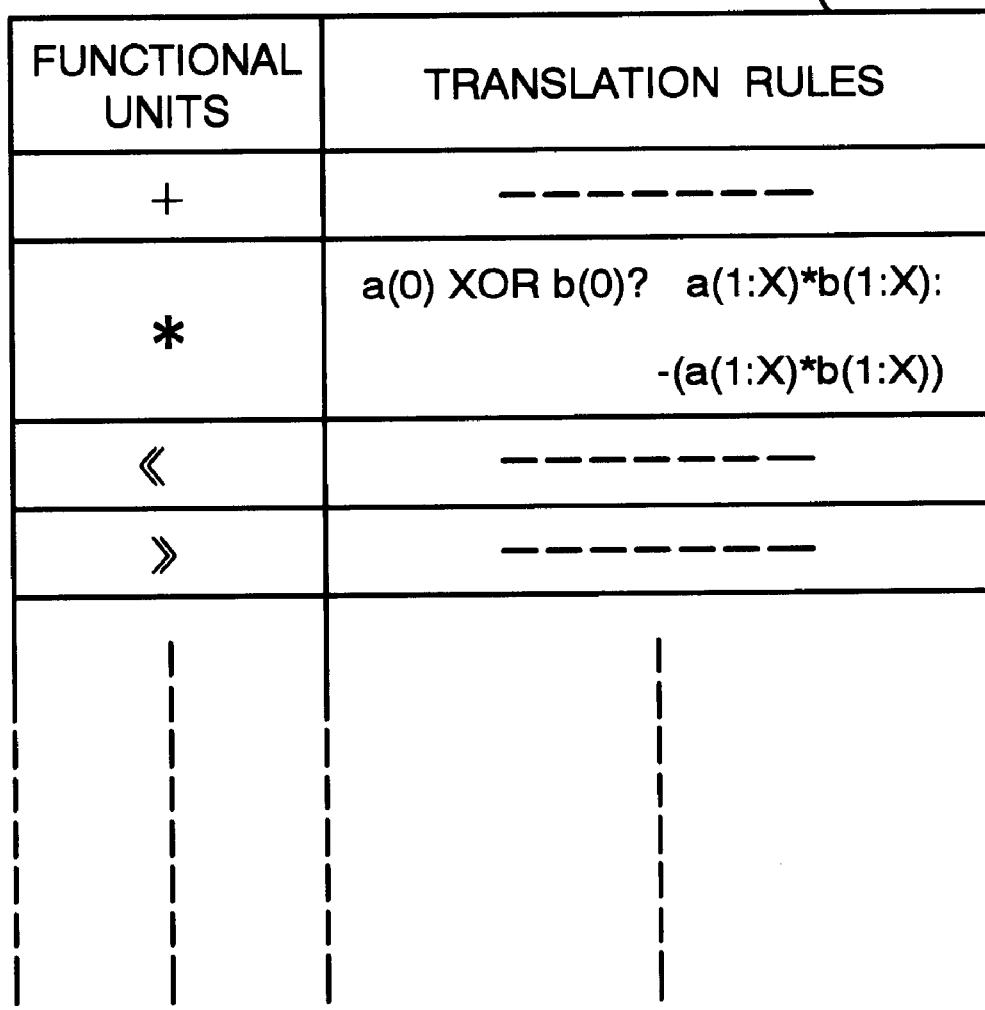
FIG. 3 is a diagram showing an example of a translation table equipped with a circuit synthesizing device according to the present invention.

In this example, when the translation rules of a multiplier as shown in FIG. 3 is stored in the translation table 100 that are stored in the memory 40, the behavior description described above is translated as follows:

signed a1(0:3),b1(0:3),c1(0:6);
unsigned a2(0:3),b2(0:3),c2(0:6);
if(cond)
{
c1=(a1(0) XOR b1(0)) ? a1(1:2)*b1(1:2): −(a1(1:2)*b1(1:2));
}
else{
c2=a2*b2;
} c1=(a1(0) XOR b1(0)) ? a1(1:2)*b1(1:2): −(a1(1:2)*b1(1:2)); represents the process in which either a1 (1:2)* b1 (1:2) or −(a1 (1:2)* b1 (1:2)) is selected depending on the result of the exclusive-OR of a1 (0) and b1 (0) (exclusive-OR between signed bits). If the result of the exclusive-OR of a1 (0) and b1 (0) is "0", the left-hand expression, a1 (1:2)* b1 (1:2) is selected since the signs of the variables a1 and b1 are the same; if the result of the exclusive-OR of a1 (0) and b1 (0) is "1", the right-hand expression, −(a1 (1:2)* b1 (1:2)), is selected since the signs of the variables a1 and b1 are not the same.

Figure 4:
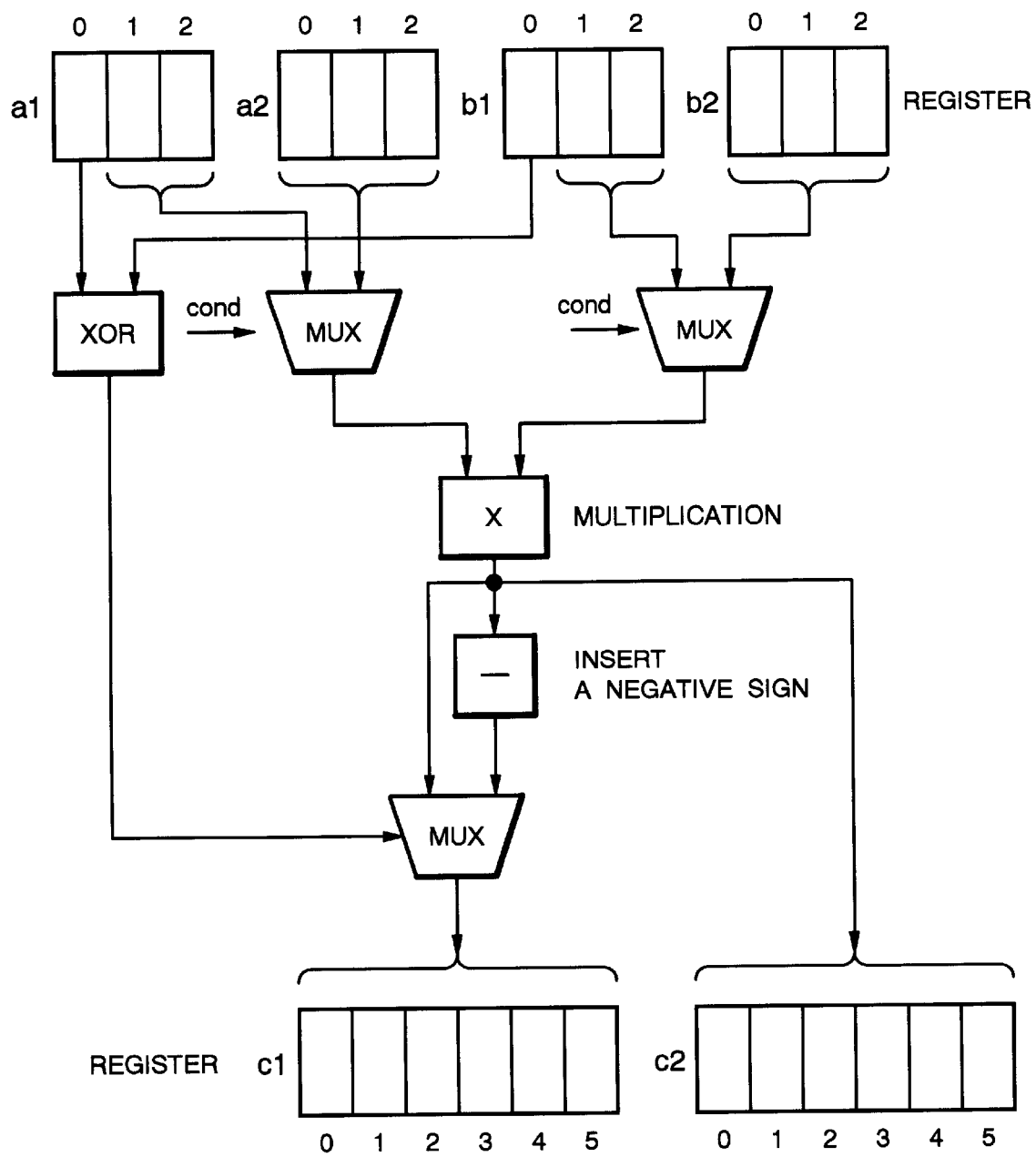
FIG. 4 is a diagram showing an example of the results of behavior synthesis that is output from a circuit synthesizing device according to the present invention.

The results of behavior synthesis according to the translated behavior description will be as shown in FIG. 4. FIG. 4 is a diagram showing an example of the results of behavior synthesis that is output from a circuit synthesizing device according to the present invention. In FIG. 4, "XOR" represents an exclusive-OR, "MUX" a multiplexer, and "×" a multiplier (a functional unit), respectively.

As shown in FIG. 4, a description in which a behavior is synthesized has a greater number of exclusive-ORs, negative signs inserted, and multiplexer modules after the insertion of negative signs when compared to conventional methods. Even so, the area of the synthesized circuit can be reduced, since each of these modules requires a smaller circuit area than a functional unit.

Furthermore, even when both operations using signed variables and operations using unsigned variables exist in a behavior description, a circuit synthesizing device according to the present invention can use C language as a hardware description language since sharing of a functional unit is possible. A behavior description written in C language can perform the synthesis process faster than a behavior description created using such well-known hardware description language as VHDL and Verilog-HDL. This is also true with simulations and other processes of a circuit behavior.

Next, the method of sharing a register in a circuit synthesizing device according to the present invention will be described.

Figure 7:
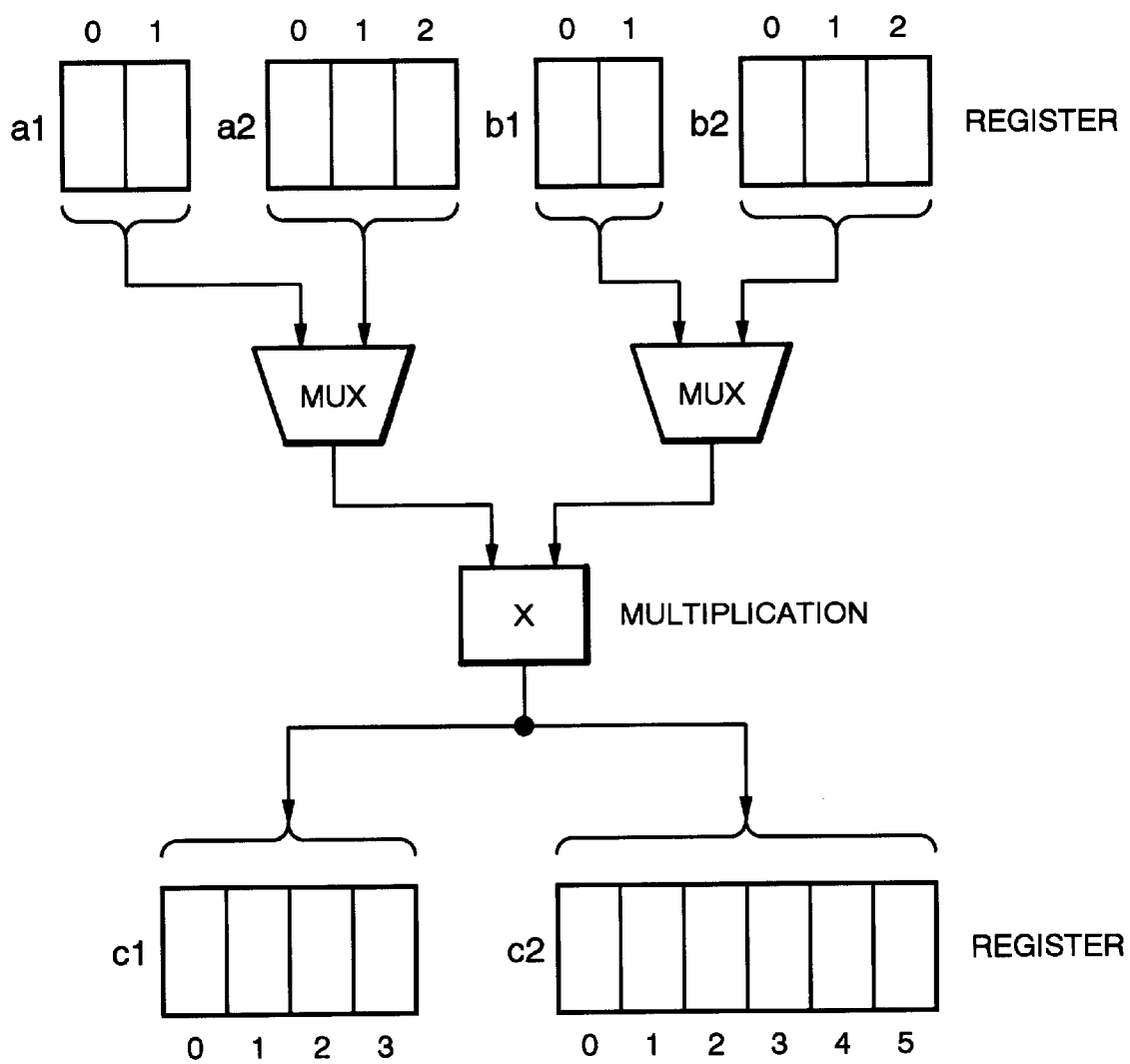
FIG. 7 is a diagram showing an example of the results of behavior synthesis that is output from a conventional circuit synthesizing device according to the present invention.
Figure 8:
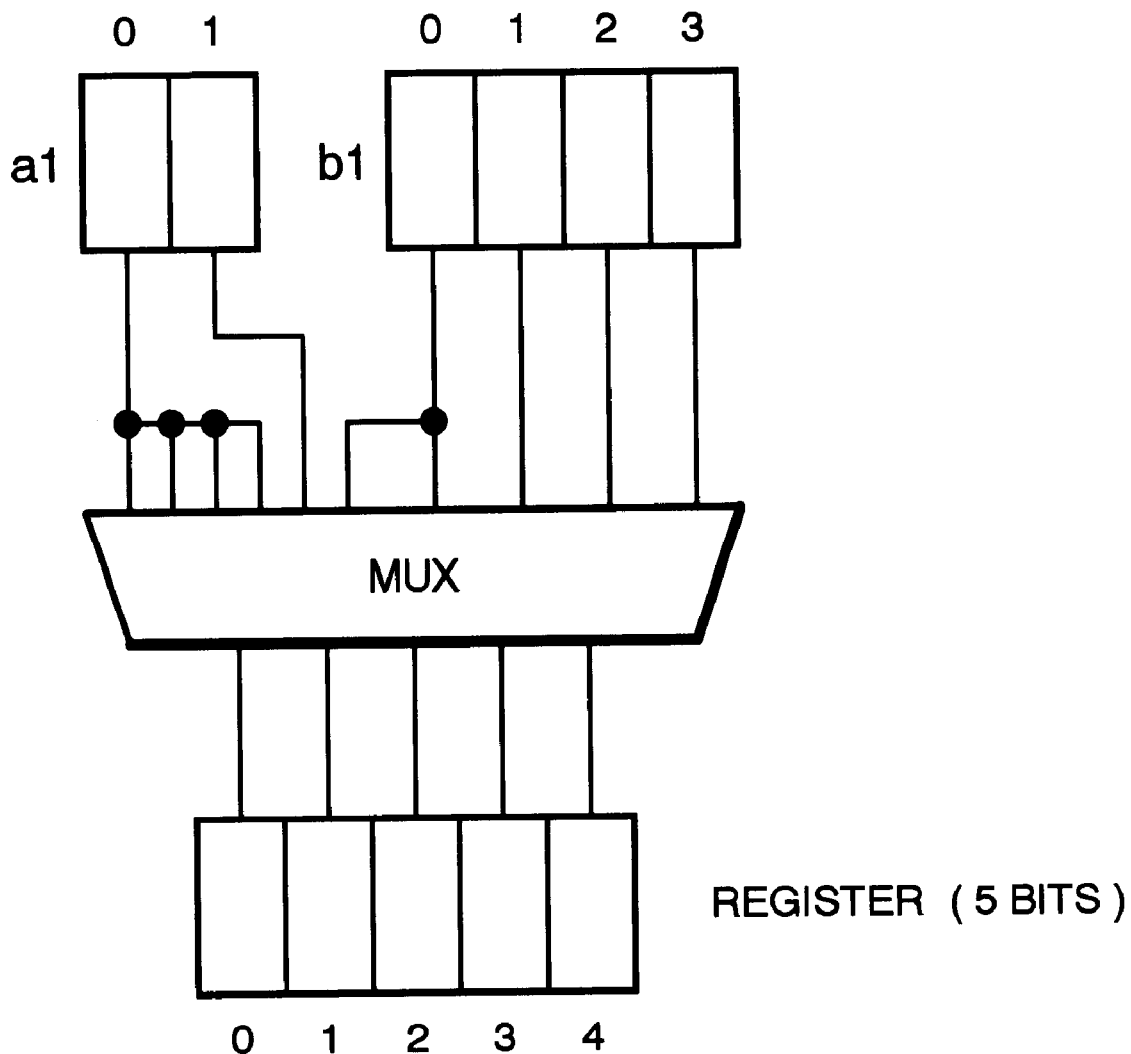
FIG. 8 is a data transfer diagram showing an example of a register sharing method for signed variables in a conventional circuit synthesizing device.
Figure 9:
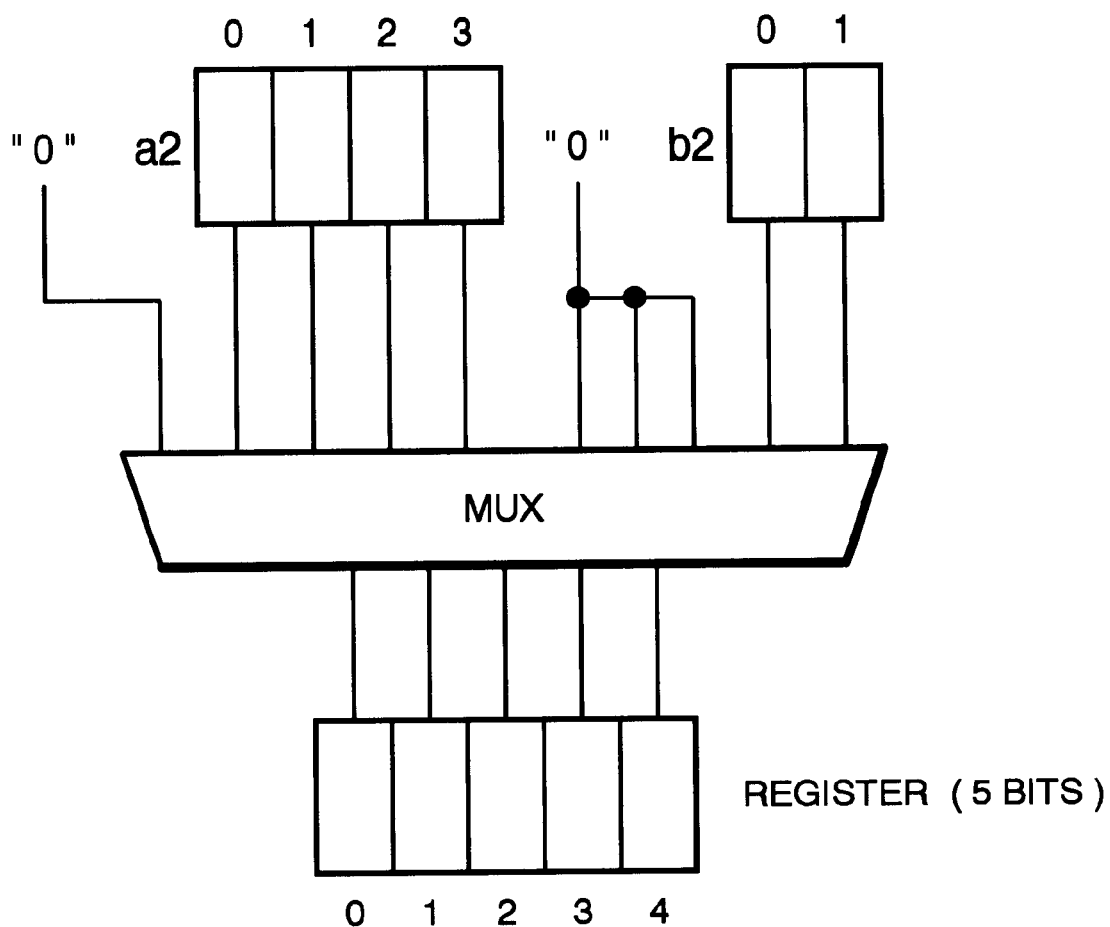
FIG. 9 is a data transfer diagram showing an example of a register sharing method for unsigned variables in a conventional circuit synthesizing device.

In conventional circuit synthesizing devices, as shown in FIGS. 7 and 8, data that are not used in the same timing are stored in the same register, for each signed variable or unsigned variable.

In a circuit synthesizing device according to the present invention, on the other hand, it is possible to store data that are not used in the same timing for signed and unsigned variable in the same register collectively.

The operation of the circuit synthesizing device when sharing a register will be described with reference to the flow chart of FIG. 5.

Figure 5:
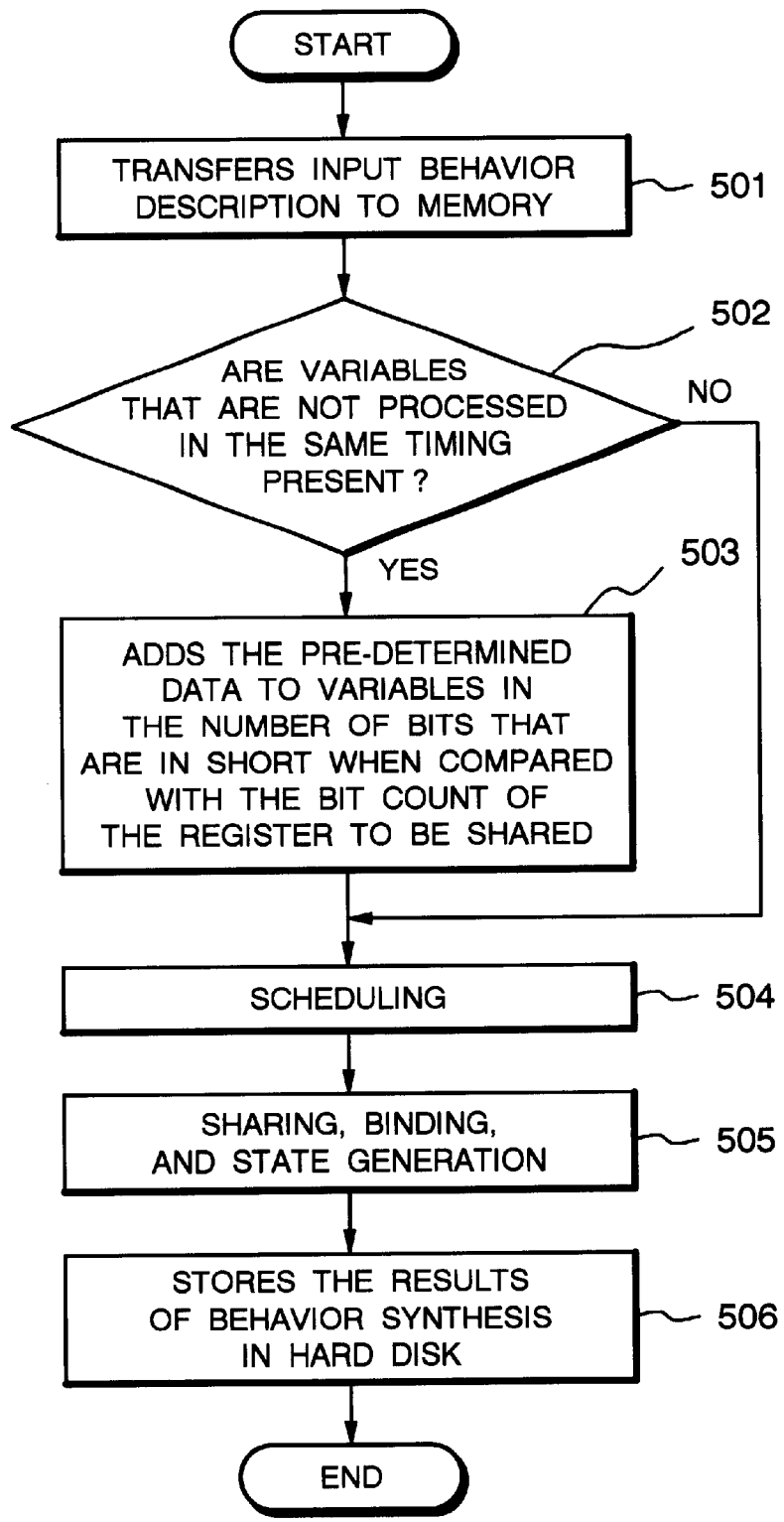
FIG. 5 is a flow chart explaining a register sharing method in a circuit synthesizing device according to the present invention.

In FIG. 5, after a behavior description is input by the operator to direct the computer to conduct behavior synthesis, the data processor 60 translates the behavior description stored in the hard disk 30 into a processable data format, and transfers the results to the memory 40 (Step 501).

The data processor 60 then finds variables that are not processed in the same timing from the behavior description stored in the memory 40 (Step 502).

If the bit count of the variable thus found is less than, in the bit count of the register to be shared, the processor adds pre-determined data, in the number of bits (a short number of bits), by which the bit count of the variable is less than the bit count of the register, to the variable (Step 503). More specifically, if the variable is a signed one, the same data as the signed bits, in the short number of bits, are added to the variable; if the variable is an unsigned one, the pre-determined data, in the short number of bits, are added to the variable.

The data processor 60 then carries out scheduling according to the translated behavior description (Step 504), and completes behavior synthesis by performing sharing of a functional unit, allocation of a register, binding, and state generation (Step 505). The results of behavior synthesis (e.g., an RTL description) is stored in the hard disk 30 (Step 506), and output in response to a request from the operator using the output device 20.

Figure 6:
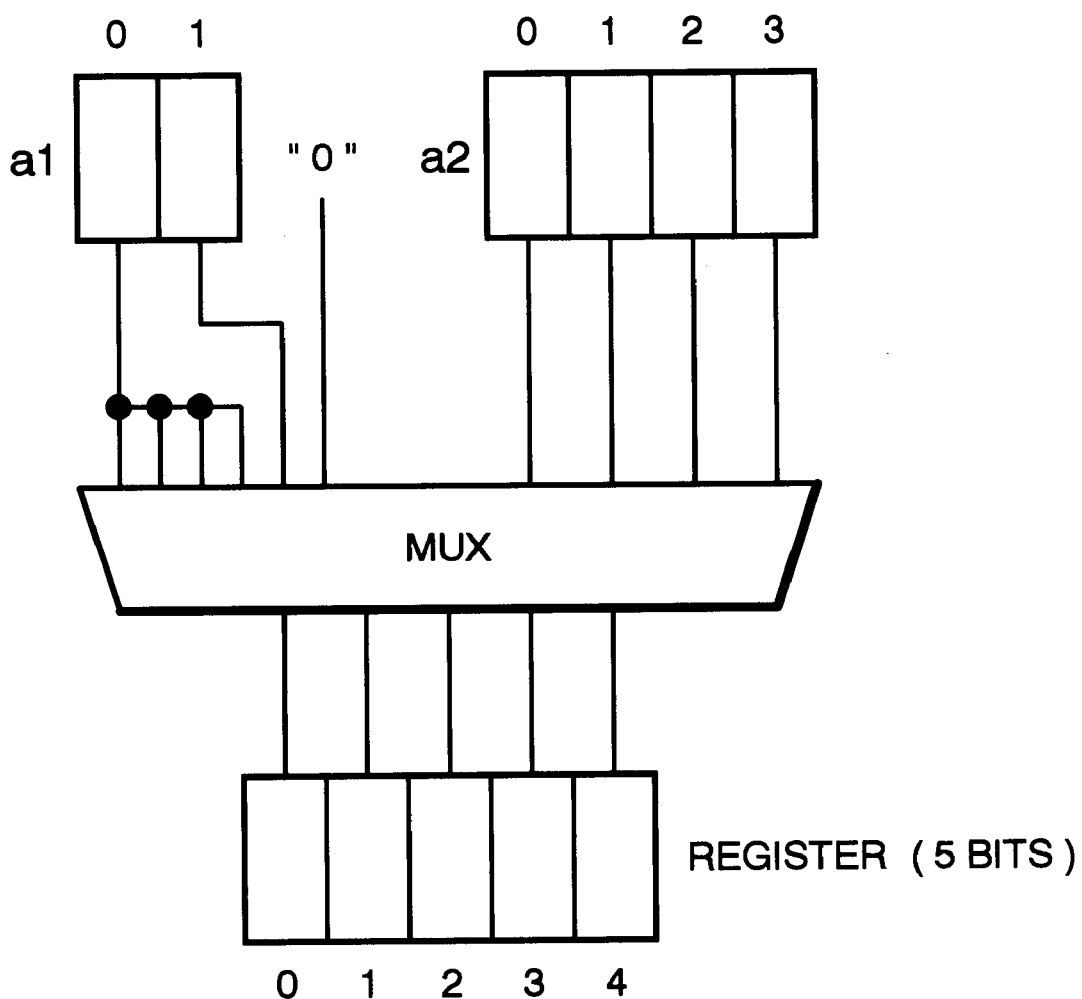
FIG. 6 is a block diagram showing an example of a register sharing method in a circuit synthesizing device according to the present invention.

FIG. 6 is a block diagram showing an example of a register sharing method in a circuit synthesizing device according to the present invention.

FIG. 6 shows the register sharing method that is conducted when transferring the value of the variable a1 to the register c1 and the value of the variable a2 to the register c2, as follows:

c1=a1;
c2=a2;

Here, the registers c1 and c2 are implemented (i.e., shared) in one register (5 bits).

In FIG. 6, for example, when transferring a1, which is a 2-bit signed variable, and a2, which is a 4-bit unsigned variable, to a common register (5 bits), bits are added to the variables a1 and a2, respectively, in the numbers that are less than the bit count of the destination register when compared. The multiplexer (MUX) then switches the variable to be transferred to the register, between a1 and a2. Here, since the $0^{th}$ bit of the variable a1 is a signed bit, the same data as the signed bits are inserted in the bits that are less than the number of bits in the register. On the other hand, since the variable a2 does not hold a signed bit, data "0s" are inserted to the bits that are in short.

Thus, a circuit synthesizing device according to the present invention can reduce a synthesized circuit in circuit area, since it can conduct sharing for not only functional units but also for registers for a description in which both signed variables and unsigned variables exist.

Furthermore, it is also possible to combine sharing of a functional unit as shown in FIG. 2 and sharing of a register as shown in FIG. 5.

Since the present invention is configured as the foregoing, it can offer the effects as described below:

A circuit synthesizing device as described above can reduce a synthesized circuit in circuit area since it can conduct sharing of a functional unit even for a description in which both signed variables and unsigned variables exist by re-writing operations using signed variables within a description into unsigned variables and then sharing a functional unit for performing identical operations from the re-written description that do not behave in the same timing.

Such a circuit synthesizing device can perform simulation of circuit behavior and other processes at a higher speed by using C language for describing hardware in which both operations using signed variables and unsigned variables exist.

Furthermore, such a circuit synthesizing device can reduce a synthesized circuit in circuit area since it can conduct sharing of a register even for a description in which both signed variables and unsigned variables exist by sharing a register after finding variables that are not processed in the same timing from a description and, if the bit count of the variable thus found is less than the bit count of the register to be shared, adding the same data as the signed bits in the number of bits (a short number of bits) by which the bit count of the variable is less than the bit count of the register in the case of a signed variable and the pre-determined data in the number of bits (a short number of bits) in the case of an unsigned variable.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A circuit synthesizing method for synthesizing a desired circuit from a behavior description indicating the behavior of a design circuit that is created in a hardware description language, comprising the steps of:

re-writing behavior description by re-writing operations using signed variables within said behavior description into operations using unsigned variables; and based on said re-written behavior description, finding identical operations that do not behave in the same timing and carrying out a process of sharing a functional unit for the variables thus found.

2. The circuit synthesizing method as set forth in claim 1, wherein translation rules for re-writing operations using signed variables into operations using unsigned variables are stored in advance, and operations using signed variables within said behavior description are re-written into operations using unsigned variables according to said translation rules.

3. The circuit synthesizing method as set forth in claim 1, wherein translation rules for re-writing operations using signed variables into operations using unsigned variables are stored in advance, operations using signed variables are detected from said behavior description, translation rules associated with the detected signed variables are extracted, and said operations using signed variables are re-written into operations using unsigned variables according to the extracted translation rules.

4. The circuit synthesizing method as set forth in claim 1, wherein
when in said operation re-writing process, said operation is multiplication,
exclusive-ORs for the signed bits of said signed variables are obtained individually,
when the result of said exclusive-OR operation is 0, the result of multiplication for the variable is output as are, and
when the result of said exclusive-OR operation is 1, a negative sign is added to the result of multiplication for the variable.

5. The circuit synthesizing method as set forth in claim 1, wherein
translation rules for re-writing operations using signed variables into operations using unsigned variables are stored in advance,
operations using signed variables are detected from said behavior description,
translation rules associated with the detected signed variables are extracted,
when in said operation re-writing process, said operation is multiplication,
exclusive-ORs for the signed bits of said signed variables are obtained individually,
when the result of said exclusive-OR operation is 0, the result of multiplication for the variable is output as are, and
when the result of said exclusive-OR operation is 1, a negative sign is added to the result of multiplication for the variable.

6. A circuit synthesizing method for synthesizing a desired circuit from a behavior description indicating the behavior of a design circuit that is created in a hardware description language, comprising the steps of:
finding variables that are not processed in a same timing from said behavior description;
comparing a bit count of the variable to a bit count of a register to be shared,
wherein if the bit count of the variable is less than the bit count of the register to be shared,
adding same data as the signed bits, in the case of a signed variable, in the number of bits by which the number of bits in the signed variable is less than the number of bits in the register; and
adding pre-determined data, in the case of an unsigned variable, in the number of bits by which the number of bits in the unsigned variable is less than the number of bits in the register, and then carrying out the process of sharing a register.

7. The circuit synthesizing method as set forth in claim 6, wherein "0s" are added as the pre-determined data.

8. A circuit synthesizing method for synthesizing a desired circuit from a behavior description indicating the behavior of a design circuit that is created in a hardware description language, comprising the steps of:
re-writing behavior description by re-writing operations using signed variables within said behavior description into operations using unsigned variables; and
finding identical operations, based on said re-written behavior description, that do not behave in the same timing and carrying out a process of sharing a functional unit for the variables thus found;
finding variables that are not processed in the same timing from said behavior description,
comparing a bit count of the variable to a bit count of the register to be shared,
wherein if the bit count of the variable is less than the bit count of the register to be shared,
adding same data as the signed bits, in the case of a signed variable, in the number of bits by which the number of bits in the signed variable is less than the number of bits in the register; and
adding pre-determined data, in the case of an unsigned variable, in the number of bits by which the number of bits in the unsigned variable is less than the number of bits in the register, and then carrying out the process of sharing a register.

9. The circuit synthesizing method as set forth in claim 8, wherein
translation rules for re-writing operations using signed variables into operations using unsigned variables are stored in advance, and
said operations using signed variables within said behavior description are re-written into operations using unsigned variables according to said translation rules.

10. The circuit synthesizing method as set forth in claim 8, wherein "0s" are added as the pre-determined data.

11. A circuit synthesizing device for synthesizing a desired circuit from a behavior description indicating the behavior of a design circuit that is created in a hardware description language, comprising:
re-writing means for re-writing operations using signed variables within said behavior description into operations using unsigned variables; and
means for sharing a functional unit for performing identical operations that do not behave in the same timing from the re-written description.

12. The circuit synthesizing device as set forth in claim 11, further comprising
translation table storing means in which translation rules for re-writing operations using signed variables into operations using unsigned variables are stored in advance, and
said operation re-writing means
re-writes operations using signed variables within said description into operations using unsigned variables according to the translation rules that are stored in said translation table storing means.

13. The circuit synthesizing device as set forth in claim 11, further comprising
translation table storing means in which translation rules for re-writing operations using signed variables into operations using unsigned variables are stored in advance,
said operation re-writing means
detects operations using signed variables from said behavior description,
extracts translation rules associated with the detected signed variables from said translation table storing means, and
re-writes said operations using signed variables into operations using unsigned variables according to the extracted translation rules.

14. The circuit synthesizing device as set forth in claim 11, wherein
said operation re-writing means
when in said operation re-writing process, said operation is multiplication, obtains exclusive-ORs for the signed bits of said signed variables individually, when the result of said exclusive-OR operation is 0, outputs the result of multiplication for the variable as are, and when the result of said exclusive-OR operation is 1, adds a negative sign to the result of multiplication for the variable.

15. The circuit synthesizing device as set forth in claim 11, further comprising translation table storing means in which translation rules for re-writing operations using signed variables into operations using unsigned variables are stored in advance, said operation re-writing means detects operations using signed variables from said behavior description, extracts translation rules associated with the detected signed variables from said translation table storing means, when in said operation re-writing process, said operation is multiplication, obtains exclusive-ORs for the signed bits of said signed variables individually, when the result of said exclusive-OR operation is 0, outputs the result of multiplication for the variable as are, and when the result of said exclusive-OR operation is 1, adds a negative sign to the result of multiplication for the variable.

16. A circuit synthesizing device for synthesizing a desired circuit from a behavior description indicating the behavior of a design circuit that is created in a hardware description language, comprising:

means for finding variables that are not processed in the same timing from said behavior description;

means for comparing a bit count of the variable to a bit count of the register to be shared, wherein if the bit count of the variable is less than the bit count of the register to be shared, adding the same data as the signed bits, in the case of a signed variable, in the number of bits by which the number of bits in the signed variable is less than the number of bits in the register, and adding pre-determined data, in the case of an unsigned variable, in the number of bits by which the number of bits in the unsigned variable is less than the number of bits in the register; and means for, after adding data to said variables, carrying out the process of sharing a register.

17. The circuit synthesizing device as set forth in claim 16, wherein "0s" are added as the pre-determined data.

18. A circuit synthesizing device for synthesizing a desired circuit from a behavior description indicating the behavior of a design circuit that is created in a hardware description language, comprising:

means for re-writing behavior description by re-writing operations using signed variables within said behavior description into operations using unsigned variables;

means for finding identical operations, based on said re-written behavior description, that do not behave in the same timing and carrying out a process of sharing a functional unit for the variables thus found;

means for finding variables that are not processed in the same timing from said behavior description;

means for adding same data as the signed bits, in the case of a signed variable, in the number of bits by which the number of bits in the signed variable is less than the number of bit s in the register and adding pre-determined data in the number of bits that are in short in the case of an unsigned variable, comparing a bit count of the variable to a bit count of the register to be shared; and means for, after adding data to said variables, carrying out the process of sharing a register.

19. The circuit synthesizing device as set forth in claim 18, further comprising translation table storing means in which translation rules for re-writing operations using signed variables into operations using unsigned variables are stored in advance, and said operation re-writing means re-writes operations using signed variables within said description into operations using unsigned variables according to the translation rules that are stored in said translation table storing means.

20. A computer readable memory that records a circuit synthesizing program for synthesizing a circuit from a behavior description indicating the behavior of a circuit that is created by a computer in a hardware description language, wherein said circuit synthesizing program causes said computer to carry out the processes of:

re-writing operations using signed variables within said behavior description into operations using unsigned variables; and sharing a functional unit for performing identical operations that do not behave in the same timing from a description that has been re-written in said translation process.

21. The computer readable memory as set forth in claim 20, wherein said circuit synthesizing program stores in advance translation rules for re-writing operations using signed variables into operations using unsigned variables, and re-writes said operations using signed variables within said behavior description into operations using unsigned variables according to said translation rules.

22. The computer readable memory as set forth in claim 20, wherein said circuit synthesizing program stores in advance translation rules for re-writing operations using signed variables into operations using unsigned variables, detects operations using signed variables from said behavior description, extracts translation rules associated with the detected signed variables, and re-writes said operations using signed variables into operations using unsigned variables according to the extracted translation rules.

23. The computer readable memory as set forth in claim 20, wherein said circuit synthesizing program when in said operation re-writing process, said operation is multiplication, obtains exclusive-ORs for the signed bits of said signed variables individually, when the result of said exclusive-OR operation is 0, outputs the result of multiplication for the variable as are, and when the result of said exclusive-OR operation is 1, adds a negative sign to the result of multiplication for the variable.

24. The computer readable memory as set forth in claim 20, wherein said circuit synthesizing program stores in advance translation rules for rewriting operations using signed variables into operations using unsigned variables, detects operations using signed variables from said behavior description, extracts translation rules associated with the detected signed variables, when in said operation re-writing process, said operation is multiplication, obtains exclusive-ORs for the signed bits of said signed variables individually, when the result of said exclusive-OR operation is 0, outputs the result of multiplication for the variable as are, and when the result of said exclusive-OR operation is 1, adds a negative sign to the result of multiplication for the variable.

25. A computer readable memory that records a circuit synthesizing program for synthesizing a circuit from a behavior description indicating the behavior of a circuit that is created by a computer in a hardware description language, wherein said circuit synthesizing program causes said computer to carry out a process of:

finding variables that are not processed in the same timing from said behavior description;

comparing a bit count of the variable to a bit count of the register to be shared, wherein if the bit count of the variable is less than the bit count of the register to be shared, adding same data as the signed bits, in the case of a signed variable, in the number of bits by which the number of bits in the signed variable is less than the number of bits in the register; and adding pre-determined data, in the case of an unsigned variable, in the number of bits by which the number of bits in the unsigned variable is less than the number of bits in the register, and then carrying out the process of sharing a register.

26. The computer readable memory as set forth in claim 25, wherein said circuit synthesizing program adds "0s" as the pre-determined data.

27. A circuit synthesizing device for synthesizing a desired circuit from a behavior description indicating the behavior of a design circuit that is created in a hardware description language, comprising:

a data processor configured to find variables that are not processed in the same timing from said behavior description;

said data processor configured to compare a bit count of the variable to the bit count of the register to be shared, wherein if the bit count of the variable is less than the bit count of the register to be shared, add same data as the signed bits, in the case of a signed variable, in the number of bits by which the number of bits in the signed variable is less than the number of bits in the register, and adding pre-determined data, in the case of an unsigned variable, in the number of bits by which the number of bits in the unsigned variable is less than the number of bits in the register, said data processor to carry out the process of sharing a register, after adding data to said variables.

* * * * *